United States Patent
Xie et al.

(10) Patent No.: US 9,780,178 B2
(45) Date of Patent: Oct. 3, 2017

(54) METHODS OF FORMING A GATE CONTACT ABOVE AN ACTIVE REGION OF A SEMICONDUCTOR DEVICE

(71) Applicant: GLOBALFOUNDRIES Inc., Grand Cayman (KY)

(72) Inventors: Ruilong Xie, Niskayuna, NY (US); Andre Labonte, Mechanicville, NY (US); Andreas Knorr, Wappingers Falls, NY (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 9 days.

(21) Appl. No.: 14/731,960

(22) Filed: Jun. 5, 2015

(65) Prior Publication Data

US 2016/0359009 A1    Dec. 8, 2016

(51) Int. Cl.
| | |
|---|---|
| H01L 21/00 | (2006.01) |
| H01L 29/423 | (2006.01) |
| H01L 23/535 | (2006.01) |
| H01L 29/06 | (2006.01) |
| H01L 29/78 | (2006.01) |
| H01L 21/28 | (2006.01) |

(52) U.S. Cl.
CPC .... *H01L 29/4232* (2013.01); *H01L 21/28008* (2013.01); *H01L 23/535* (2013.01); *H01L 29/0649* (2013.01); *H01L 29/7851* (2013.01)

(58) Field of Classification Search
CPC ........... H01L 29/66545; H01L 29/6656; H01L 29/78; H01L 29/517; H01L 29/42372; H01L 29/513; H01L 29/518; H01L 29/512; H01L 21/32133; H01L 21/31111; H01L 21/02164; H01L 21/0217

See application file for complete search history.

(56) References Cited

U.S. PATENT DOCUMENTS

| | | | | |
|---|---|---|---|---|
| 5,861,329 | A * | 1/1999 | Yeh | H01L 21/28176 257/E21.194 |
| 6,025,230 | A * | 2/2000 | Hshieh | H01L 29/402 257/E21.418 |
| 2005/0059198 | A1* | 3/2005 | Visokay | H01L 21/28088 438/199 |
| 2013/0200441 | A1* | 8/2013 | Labont | H01L 21/82382 257/288 |

* cited by examiner

*Primary Examiner* — Dale E Page
*Assistant Examiner* — Quovaunda V Jefferson
(74) *Attorney, Agent, or Firm* — Amerson Law Firm, PLLC

(57) ABSTRACT

One method disclosed herein includes, among other things, forming a gate contact opening in a layer of insulating material, wherein the gate contact opening is positioned at least partially vertically above a active region, the gate contact opening exposing a portion of at least a gate cap layer of a gate structure, performing at least one etching process to remove the gate cap layer and recess a sidewall spacer so as to thereby define a spacer cavity and expose at least an upper surface of a gate electrode within the gate contact opening, filling the spacer cavity with an insulating material while leaving the upper surface of the gate electrode exposed, and forming a conductive gate contact in the gate contact opening.

12 Claims, 15 Drawing Sheets

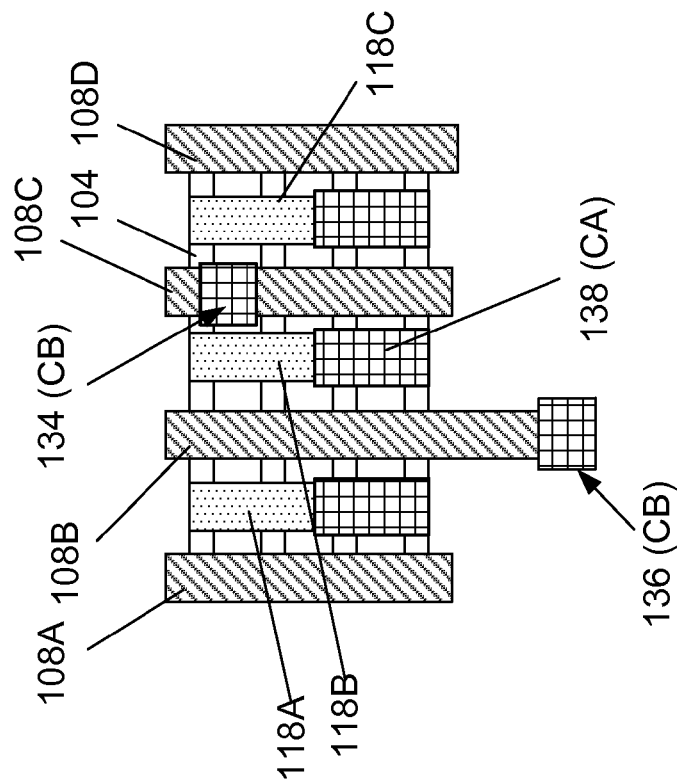
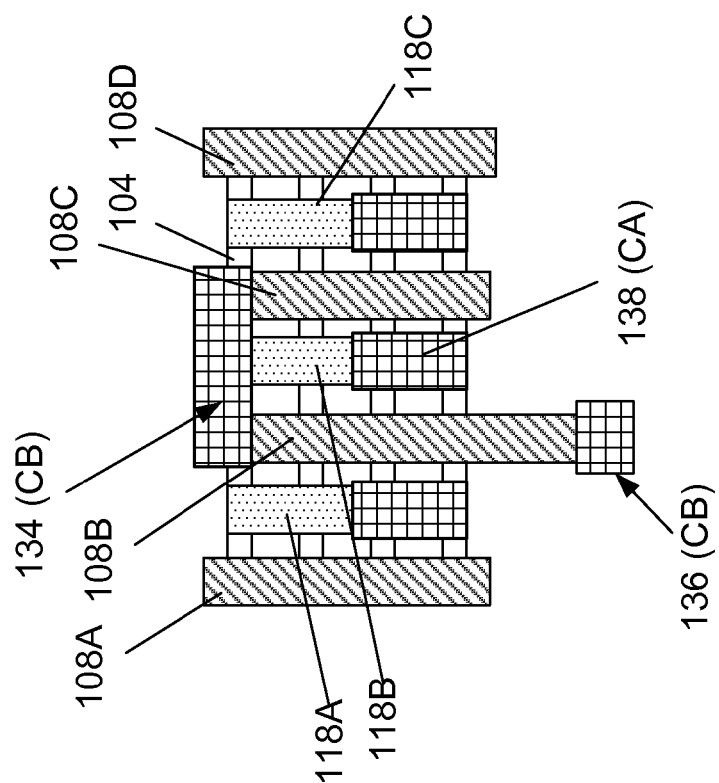

US 9,780,178 B2

METHODS OF FORMING A GATE CONTACT ABOVE AN ACTIVE REGION OF A SEMICONDUCTOR DEVICE

BACKGROUND OF THE INVENTION

1. Field of the Invention

The present disclosure generally relates to the fabrication of integrated circuits, and, more particularly, to various methods of forming a gate contact above an active region of a semiconductor device.

2. Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar devices, FinFET devices, nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

In contrast to a planar FET, which, as the name implies, is a generally planar structure, a so-called FinFET device has a three-dimensional (3D) structure. FIG. 1A is a perspective view of an illustrative prior art FinFET semiconductor device 10 that is formed above a semiconductor substrate 12 that will be referenced so as to explain, at a very high level, some basic features of a FinFET device. In this example, the FinFET device 10 includes three illustrative fins 14, a gate structure 16, a sidewall spacer 18 and a gate cap layer 20. Trenches 22 are formed in the substrate 12 to define the fins 14. A recessed layer of insulating material (not shown) is positioned between the fins 14 in the areas outside of the gate structure, i.e., in the source/drain regions of the device 10. The gate structure 16 is typically comprised of a layer of gate insulating material (not separately shown), e.g., a layer of high-k insulating material (k-value of 10 or greater) or silicon dioxide, and one or more conductive material layers (e.g., metal and/or polysilicon) that serve as the gate electrode for the device 10. The fins 14 have a three-dimensional configuration: a height H, a width W and an axial length L. The axial length L corresponds to the direction of current travel in the device 10 when it is operational. The portions of the fins 14 covered by the gate structure 16 are the channel regions of the FinFET device 10. The gate structures 16 for such FinFET devices 10 may be manufactured using so-called "gate-first" or "replacement gate" (gate-last) manufacturing techniques. A FinFET device may have either a tri-gate or dual-gate channel region. For a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior FET structure as compared to that of a planar FET, especially in the 20 nm CMOS technology node and beyond.

To improve the operating speed of FETs, and to increase the density of FETs on an integrated circuit device, device designers have greatly reduced the physical size of FETs over the years, particularly the channel length of transistor devices. As a result of the reduced dimensions of the transistor devices, the operating speed of the circuit components has been increased with every new device generation, and the "packing density," i.e., the number of transistor devices per unit area, in such products has also increased during that time. Typically, due to the large number of circuit elements and the required complex layout of modern integrated circuits, the electrical connections or "wiring arrangement" for the individual circuit elements cannot be established within the same device level on which the circuit elements are manufactured. Accordingly, the various electrical connections that constitute the overall wiring pattern for the integrated circuit product are formed in one or more additional stacked so-called "metallization layers" that are formed above the device level of the product. These metallization layers are typically comprised of layers of insulating material with conductive metal lines or conductive vias formed in the layers of material. Generally, the conductive lines provide the intra-level electrical connections, while the conductive vias provide the inter-level connections or vertical connections between different levels. These conductive lines and conductive vias may be comprised of a variety of different materials, e.g., copper, with appropriate barrier layers, etc. The first metallization layer in an integrated circuit product is typically referred to as the "M1" layer, while the conductive vias that are used to establish electrical connection between the M1 layer and lower level conductive structures (explained more fully below) are typically referred to as "V0" vias. The conductive lines and conductive vias in these metallization layers are typically comprised of copper, and they are formed in layers of insulating material using known damascene or dual-damascene techniques.

FIG. 1B is a cross-sectional view of an illustrative integrated circuit product 10A comprised of a plurality of transistor devices 15 formed in and above a semiconductor substrate 12A. A schematically depicted isolation region 13 has also been formed in the substrate 12A. In the depicted example, the transistor devices 15 are comprised of an illustrative gate structure, i.e., a gate insulation layer 15A and a gate electrode 15B, a gate cap layer 21, a sidewall spacer 23 and simplistically depicted source/drain regions 25. At the point of fabrication depicted in FIG. 1B, layers of insulating material 17A, 17B, i.e., interlayer dielectric materials, have been formed above the product 10A. Other layers of material, such as contact etch stop layers and the like, are not depicted in the attached drawings. Also depicted are illustrative source/drain contact structures 27 which include a combination of a so-called "trench silicide" (TS) structure 29 and a so-called "CA contact" structure 31. Also depicted is a gate contact structure 33 which is sometimes referred to as a "CB contact" structure. The CB contact 33 is formed so as to contact a portion of the gate electrode 15B of one of the transistors 15. In a plan view, the CB gate contact 33 is positioned vertically above an isolation region 13 that surrounds the product 10A, i.e., the CB gate contact 33 is not positioned above the active region defined in the substrate 12A. The CA contact structures 31 may be in the form of discrete contact elements, i.e., one or more individual contact plugs having a generally square-like or cylindrical shape, that are formed in an interlayer dielectric material, as shown in FIG. 1B. In other applications (not shown in FIG. 1B), the CA contact structures 31 may also be a line-type feature that contacts underlying line-type features, e.g., the TS structure 29 that contacts the source/drain region 25 and typically extends across the entire active region on the source/drain region 25. Also depicted in FIG. 1B is the first metallization layer—the so-called M1 layer—of the multi-level metallization system for the product 10A that is formed in a layer of insulating material 35, e.g., a low-k insulating material. A plurality of conductive vias—so-called V0 vias 37—are provided to establish electrical connection between the device-level contacts—CA contacts 31 and the CB contact 33—and the M1 layer. The M1 layer typically includes a plurality of metal lines 39 that are routed as needed across the product 10A.

In one embodiment, the process flow of forming the TS structures 29, CA contacts 31 and CB contacts 33 may be as follows. After the first layer of insulating material 17A is deposited, TS openings are formed in the first layer of insulating material 17A that expose portions of underlying source/drain regions 25. Thereafter, traditional silicide is formed through the TS openings, followed by forming tungsten (not separately shown) on the metal silicide regions, and performing a chemical mechanical polishing (CMP) process down to the top of the gate cap layer 21. Then, the second layer of insulating material 17B is deposited and contact openings for the CA contacts 31 are formed in the second layer of insulating material 17B that expose portions of the underlying tungsten metallization above the source/drain regions 25. Next, while the opening for the CA contacts 31 is masked, the opening for the CB contact 33 is formed in the second layer of insulating material 17B and through the gate cap layer 21 so as to expose a portion of the gate electrode 15B. Typically, the CB contact 33 is in the form of a round or square plug. Thereafter, the conductive CA contacts 31 and the conductive CB contact 33 are formed in their corresponding openings in the second layer of insulating material 17B by performing one or more common metal deposition and CMP process operations, using the second layer of insulating material 17B as a polish-stop layer to remove excess material positioned outside of the contact openings. The CA contacts 31 and CB contact 33 typically contain a uniform body of metal, e.g., tungsten, and may also include one or more metallic barrier layers (not shown) positioned between the uniform body of metal and the layer of insulating material 17B. The source/drain contact structures 27 (TS contacts 29, CA contacts 31) and the CB contact 33 are all considered to be device-level contacts within the industry.

FIG. 1C is a simplistic plan view of an illustrative FinFET device comprised of three illustrative fins 41. Also depicted are illustrative CA contacts 31, a CB contact 33, a gate cap layer 21, sidewall spacers 23 and the trench silicide structures 29 formed above the source/drain regions 25. As noted above, the CB gate contact 33 is positioned vertically above the isolation region 13 that surrounds the product 10A, i.e., the CB gate contact 33 is not positioned above the active region defined in the substrate 12A. The CB gate contact 33 is positioned above the isolation region 13 so as to avoid or reduce the chances of creating an electrical short between the CB contact 33 and the TS structure 29, i.e., there is a minimum spacing 43 that must be maintained between these two structures according to various design rules in an attempt to prevent such electrical shorts. Unfortunately, there is an area penalty associated with the requirement that the CB contact 33 only be positioned above the isolation region 13. What is needed is a method for forming the CB gate contact 33 above the active region of the device so as to conserve valuable plot space on an integrated circuit product.

The present disclosure is directed to various methods of forming a gate contact above an active region of a semi-conductor device and the resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a gate contact above an active region of a semiconductor device. One method disclosed herein includes, among other things, forming a gate structure above at least an active region, forming a layer of insulating material above the gate structure and forming a gate contact opening in the layer of insulating material, wherein the gate contact opening is positioned at least partially vertically above the active region, the gate contact opening exposing a portion of at least a gate cap layer of a gate structure. In this example, the method further includes performing at least one etching process through the gate contact opening to remove the gate cap layer and recess a sidewall spacer so as to thereby define a spacer cavity positioned above the recessed spacer and expose at least an upper surface of a gate electrode within the gate contact opening, performing at least one process operation to fill the spacer cavity with an insulating material while leaving the upper surface of the gate electrode exposed, and forming a conductive gate contact in the gate contact opening that is conductively coupled to the exposed upper surface of the gate electrode, wherein the gate contact is positioned at least partially vertically above the active region. In some applications, the entire gate contact opening and the entire gate contact may be positioned vertically above the active region.

Another illustrative method disclosed herein includes, among other things, forming a gate structure above at least an active region, forming a layer of insulating material above the gate structure and forming a gate contact opening in the layer of insulating material, wherein the entire gate contact opening is positioned vertically above the active region, the gate contact opening exposing a portion of at least a gate cap layer. In this example, the method also includes performing at least one etching process through the gate contact opening to remove the gate cap layer and recess a sidewall spacer so as to thereby define a spacer cavity positioned above the recessed spacer and expose at least an upper surface of a gate electrode within the gate contact opening, performing a conformal deposition process to form a conformal layer of insulating material in the gate contact opening so as to overfill the spacer cavity, performing an etching process so as to remove portions of the conformal layer of insulating material while a remaining portion of the conformal layer of insulating material is positioned in the spacer cavity above the recessed spacer, and forming a conductive gate contact in the gate contact opening that is conductively coupled to the exposed upper surface of the gate electrode, wherein the entire gate contact is positioned vertically above the active region.

One illustrative device disclosed herein includes, among other things, an isolation region that defines an active region in a semiconducting substrate, a gate electrode, a recessed sidewall spacer positioned proximate opposite sides of the gate electrode, a layer of insulating material positioned above the gate electrode, a gate contact opening in the layer of insulating material, wherein the gate contact opening is positioned at least partially vertically above the active region and wherein the gate contact opening exposes a portion of the gate electrode within the gate contact opening, a conductive gate contact positioned in the gate contact opening that is conductively coupled to the exposed portion of the gate electrode, wherein the gate contact is positioned at least partially vertically above the active region, and an insulating material positioned proximate the opposite sides of the gate electrode above the recessed spacer and below a portion of the conductive gate contact.

BRIEF DESCRIPTION OF THE DRAWINGS

The disclosure may be understood by reference to the following description taken in conjunction with the accompanying drawings, in which like reference numerals identify like elements, and in which.

Figure 1A:
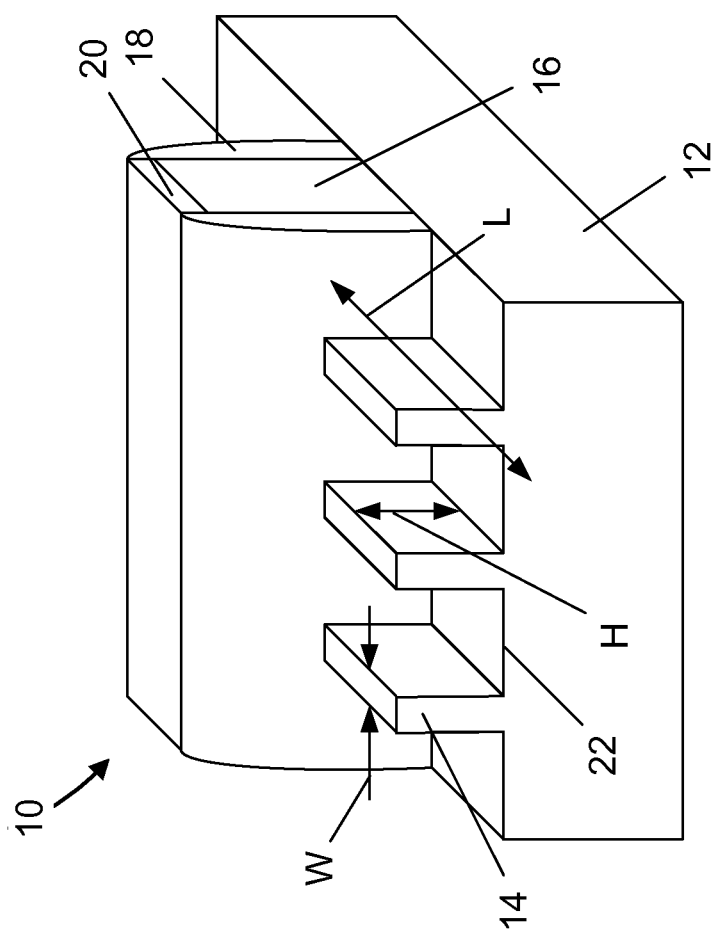
FIG. 1A is a simplistic depiction of an illustrative prior art FinFET device.
Figure 1B:
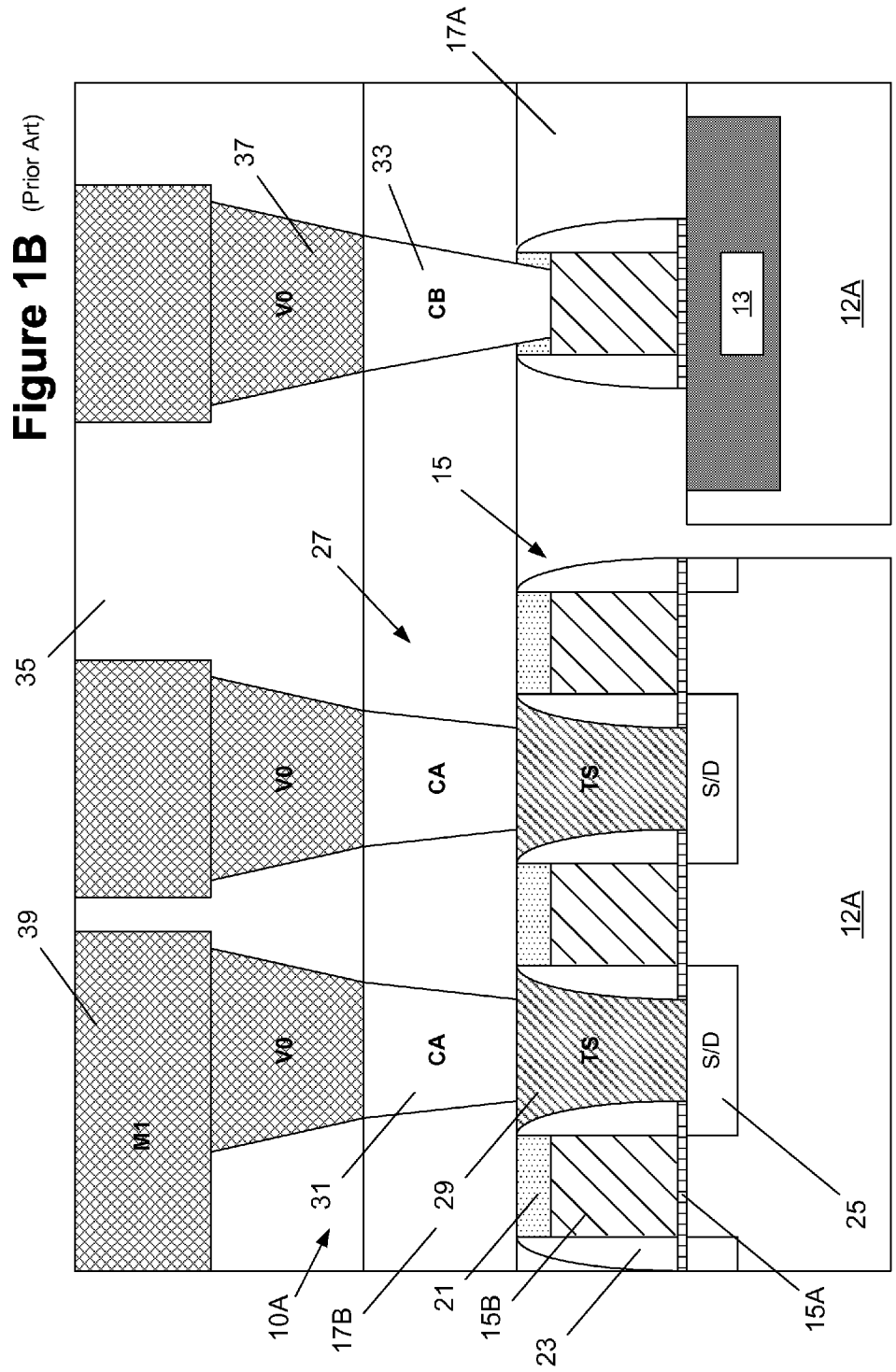
FIGS. 1B-1C depict various illustrative prior art arrangements of device-level contacts and metallization layers for an integrated circuit product.
Figure 1C:
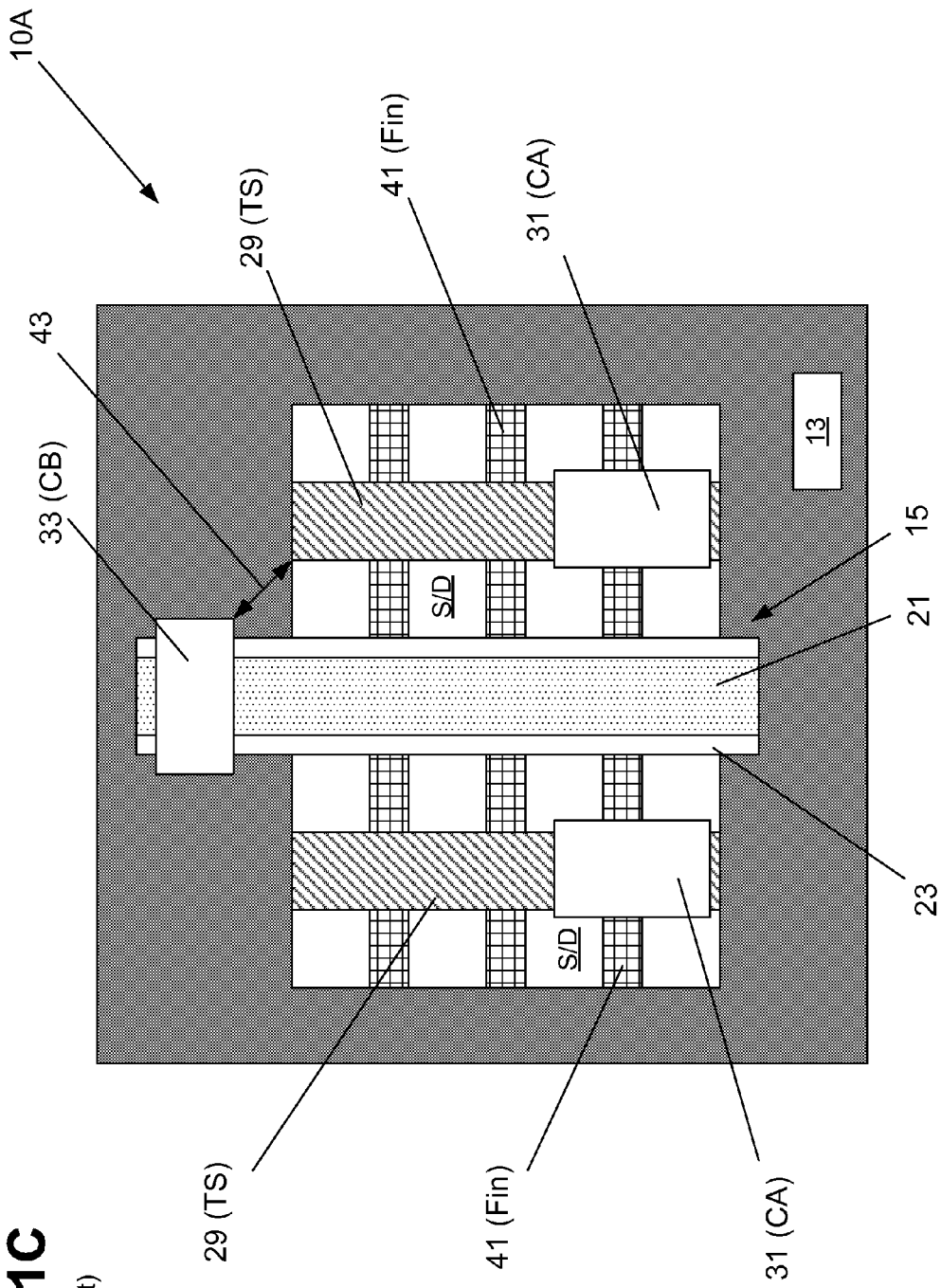

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to forming a gate contact above an active region of a semiconductor device. As will be readily apparent to those skilled in the art upon a complete reading of the present application, the present method is applicable to a variety of products, including, but not limited to, logic products, memory products, etc. Moreover, the methods disclosed herein may be employed to form gate contacts above a variety of different devices, e.g., planar devices, FinFET devices, nanowire devices, etc. The present subject matter will be disclosed in the context of forming an integrated circuit product comprised of illustrative FinFET devices. However, as will be appreciated by those skilled in the art after a complete reading of the present application, the methods and devices disclosed herein are not limited to use with FinFET devices, e.g., they may be employed with planar devices. With reference to the attached figures, various illustrative embodiments of the methods and devices disclosed herein will now be described in more detail.

Figure 2A:
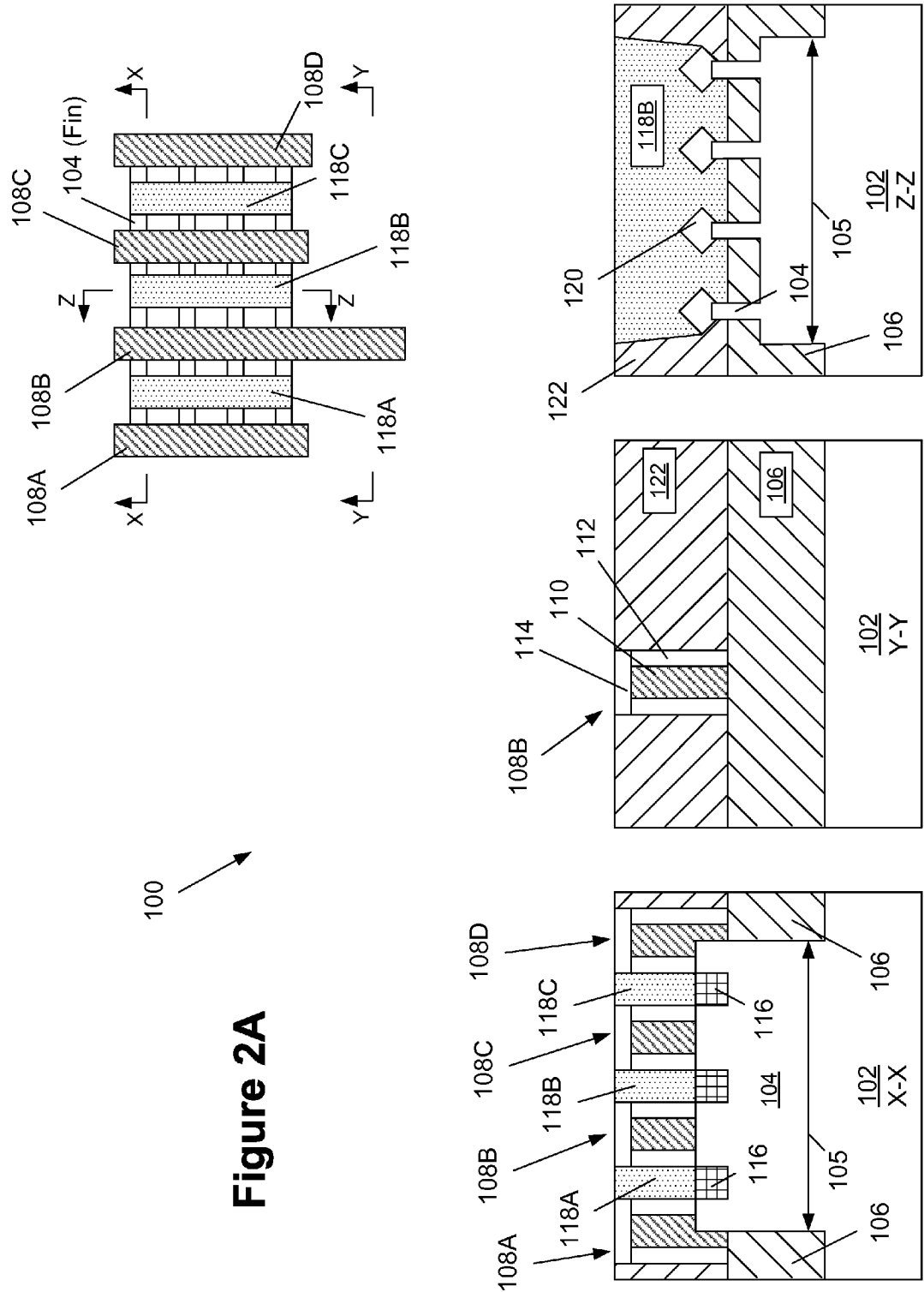
FIGS. 2A-2N depict various methods disclosed herein for forming a gate contact above an active region of a semiconductor device.
Figure 2B:
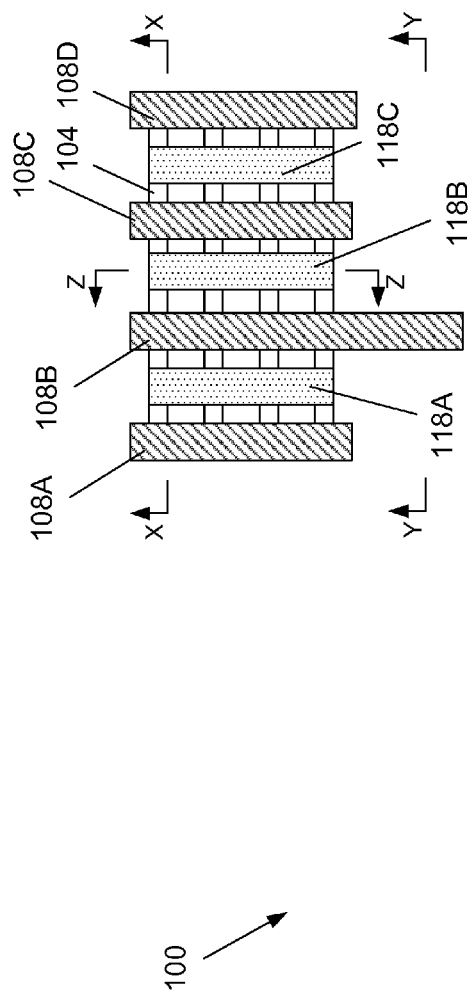
Figure 2B:
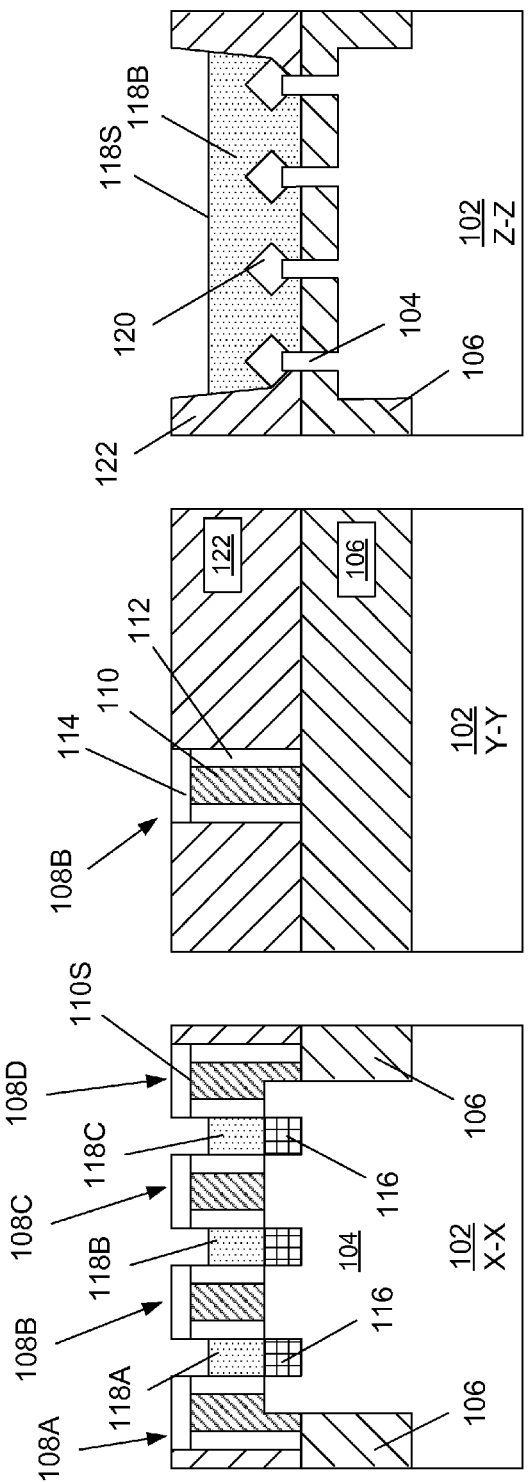
Figure 2C:
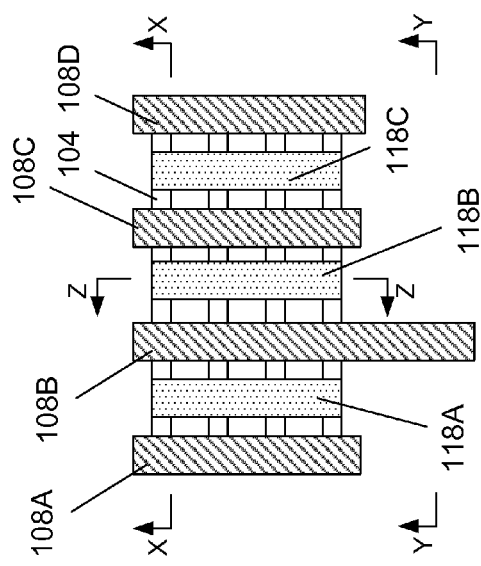
Figure 2C:
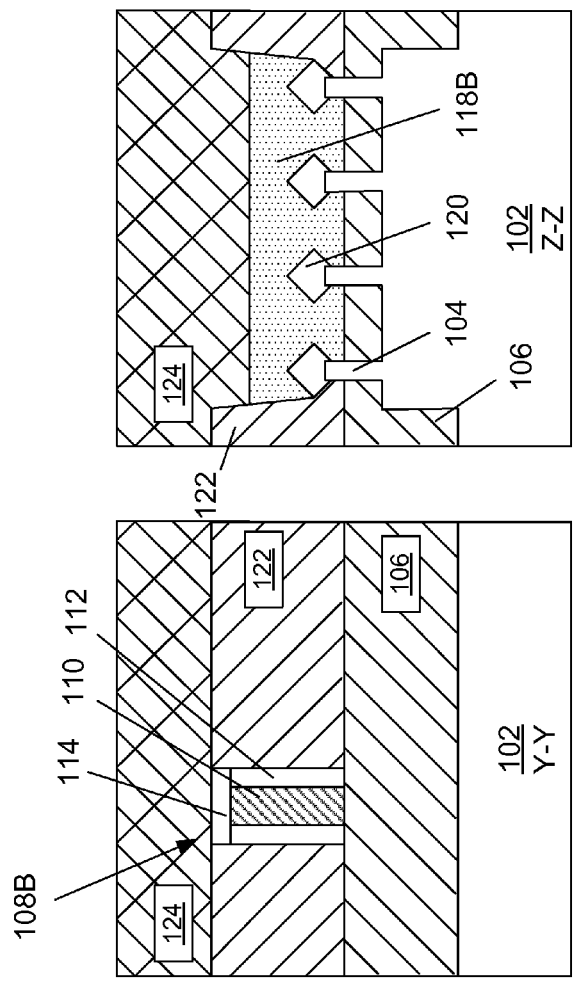
Figure 2C:
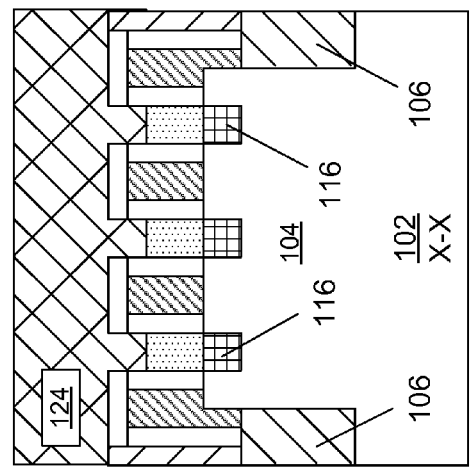
Figure 2D:
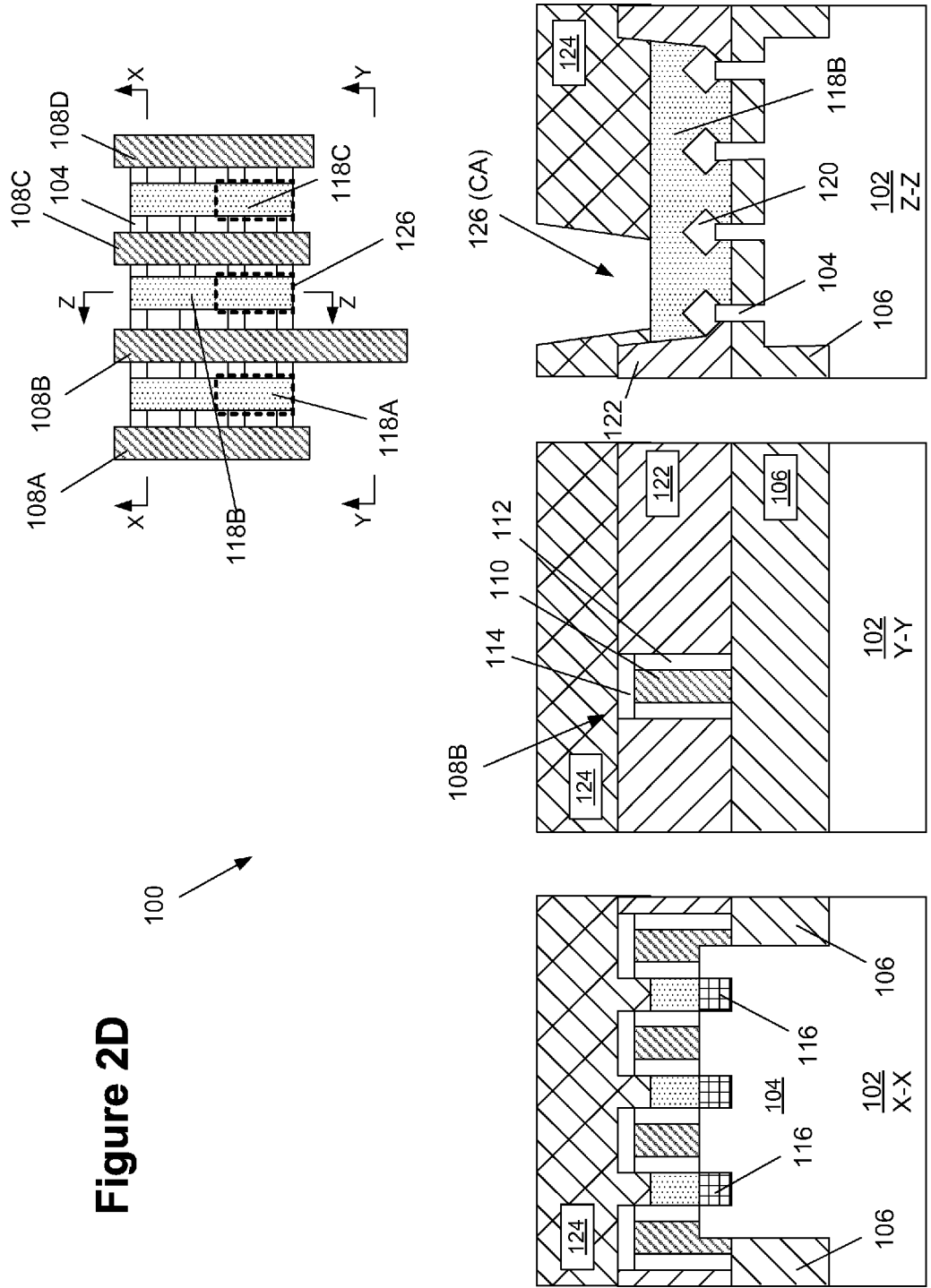
Figure 2E:
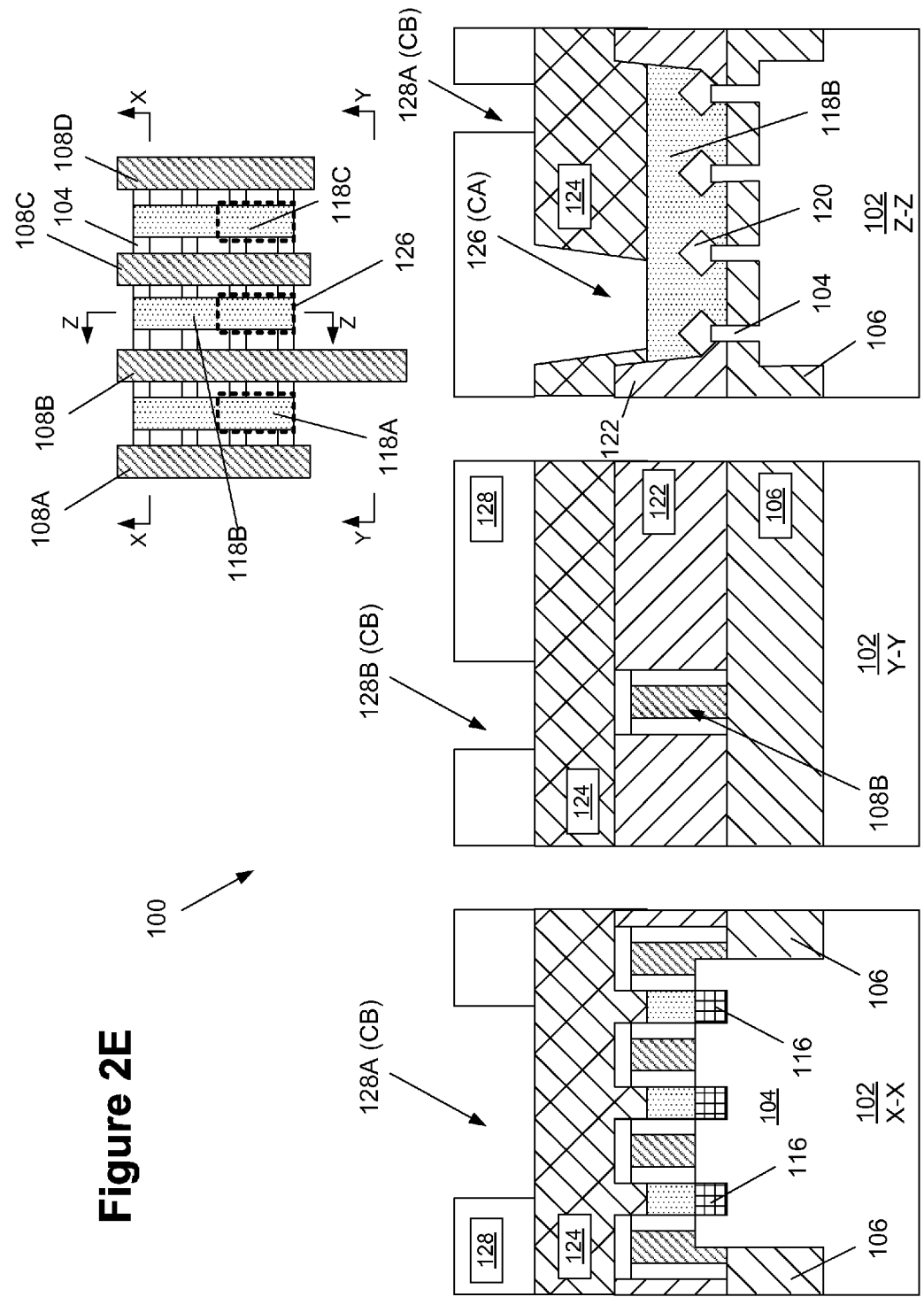
Figure 2F:
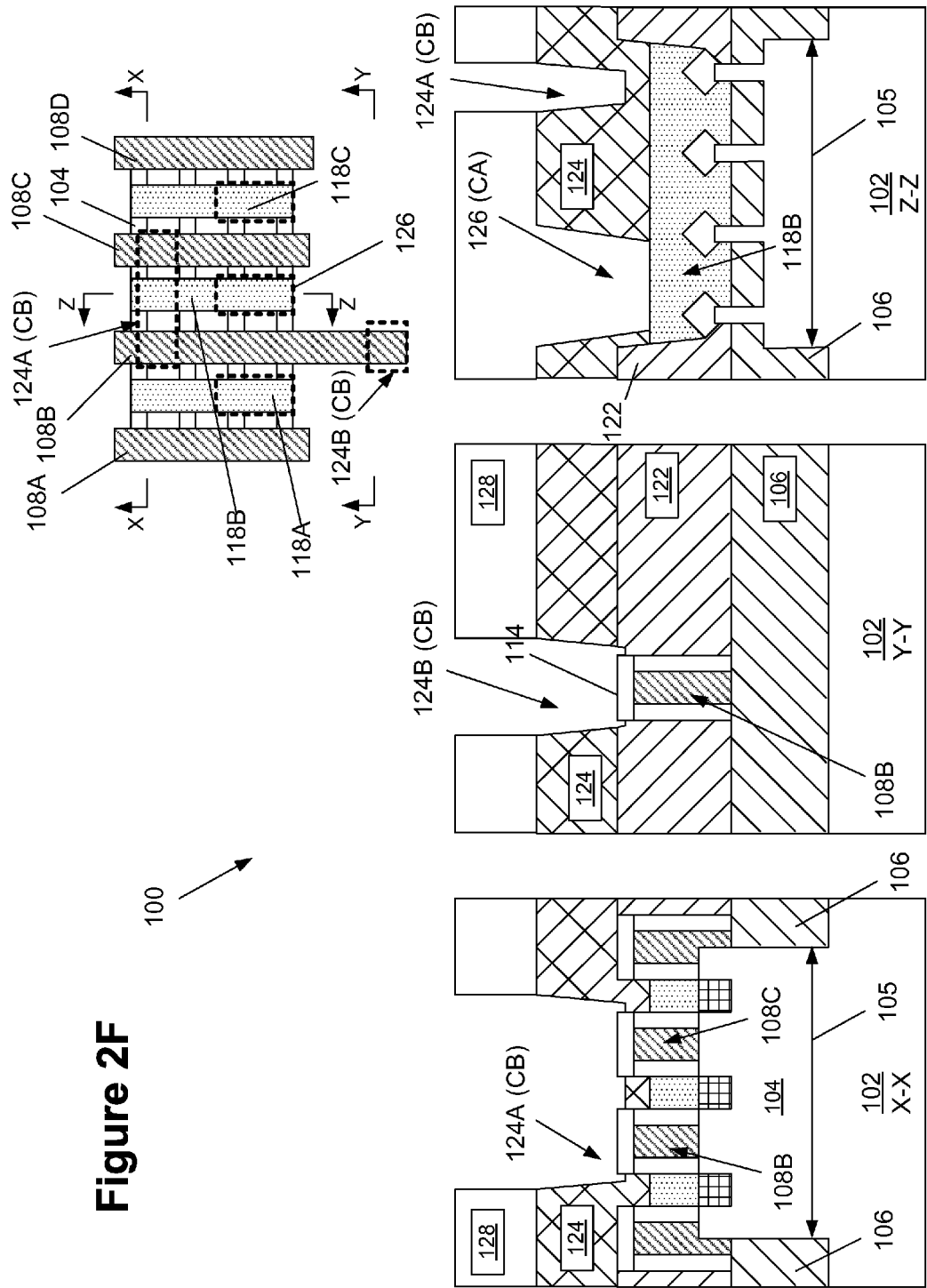
Figure 2G:
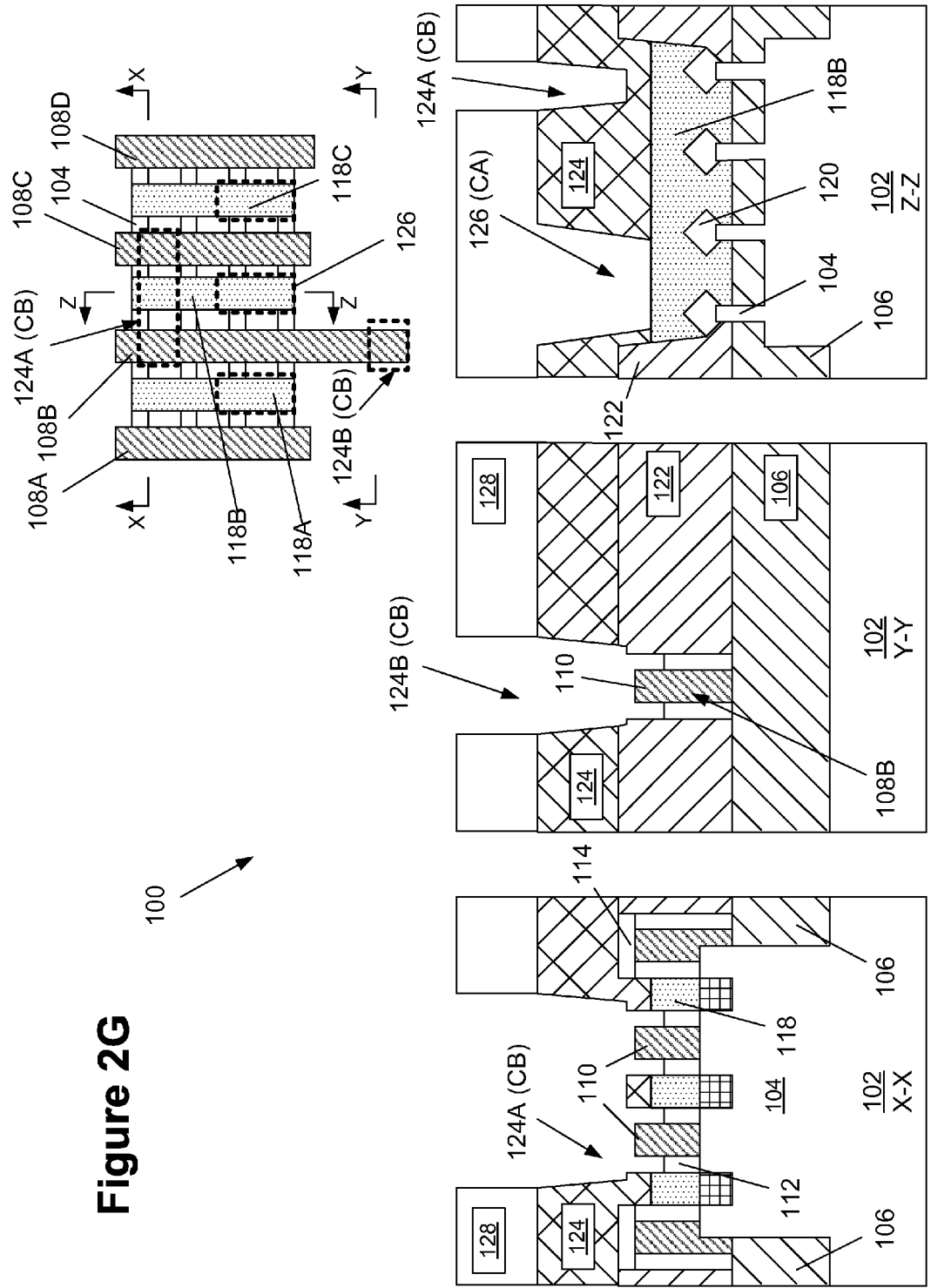
Figure 2H:
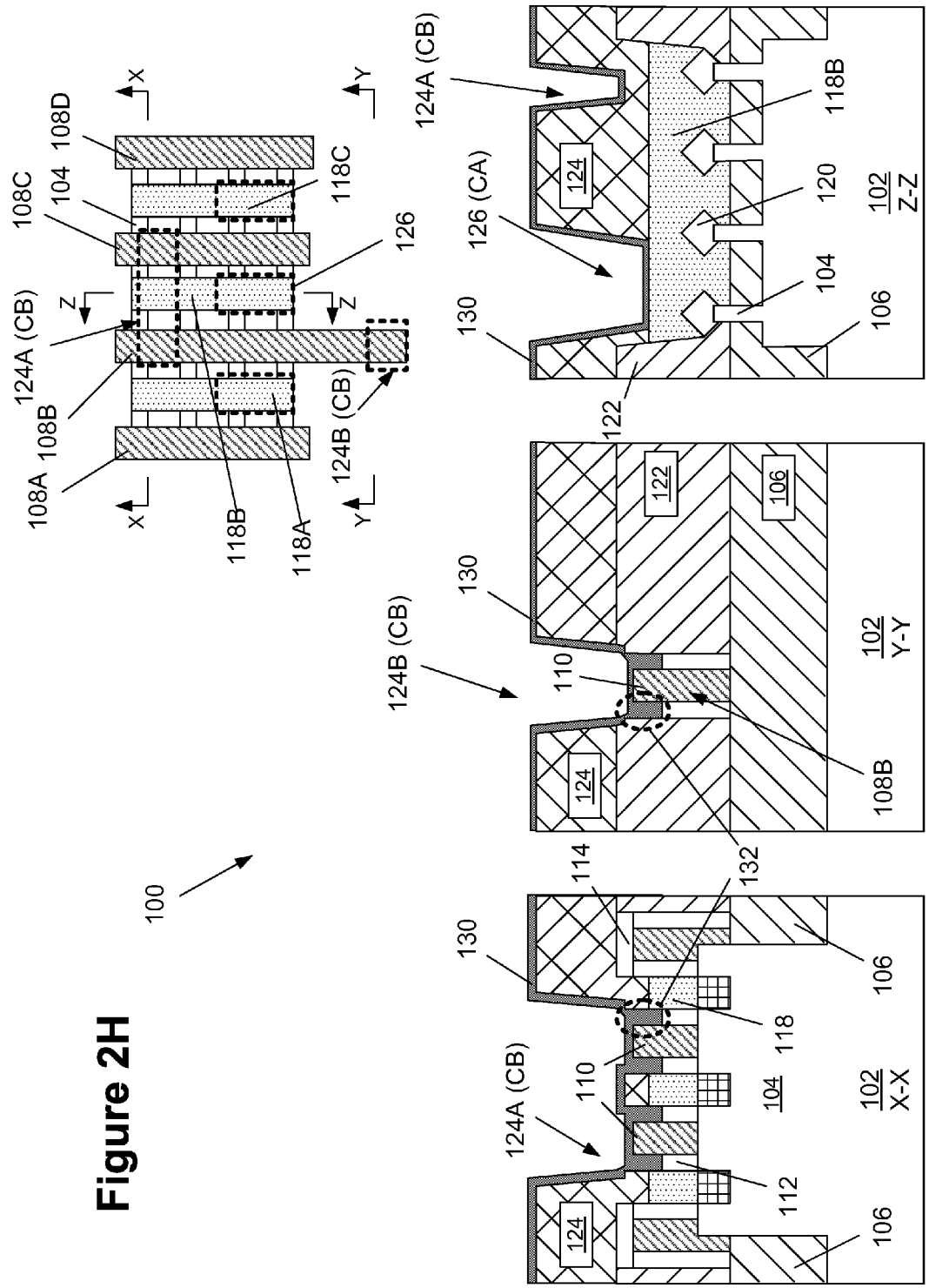
Figure 2I:
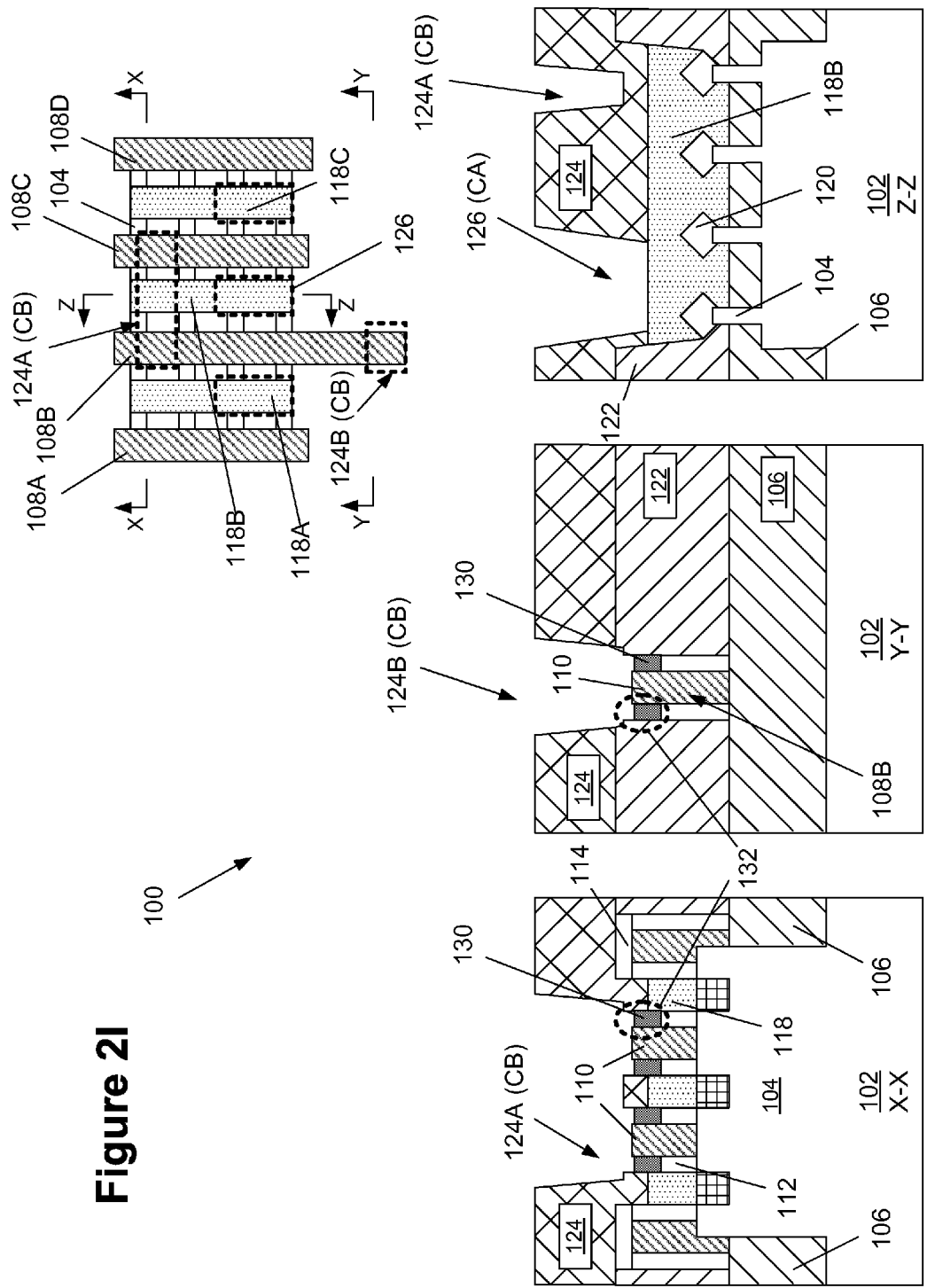
Figure 2J:
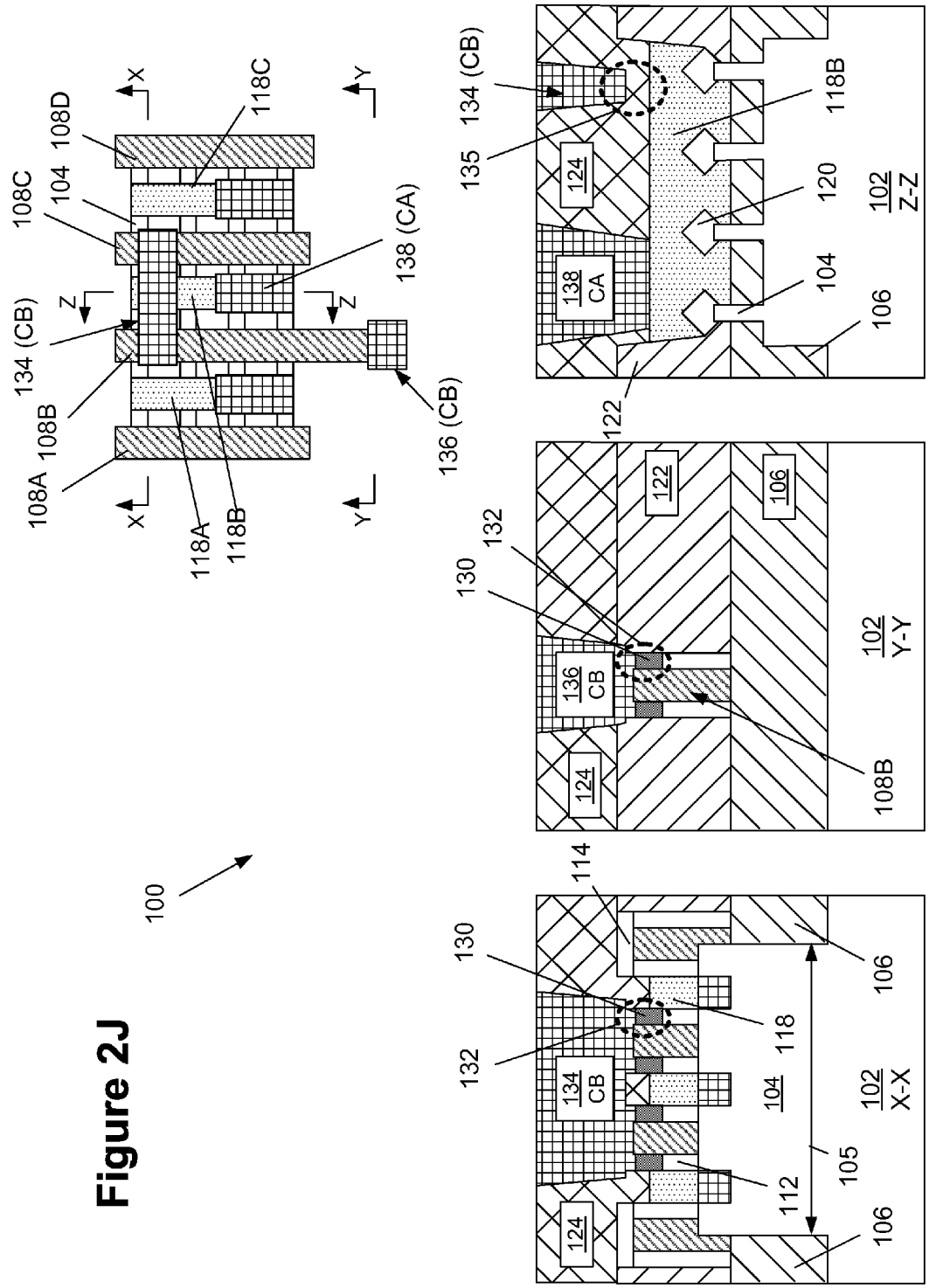
Figure 2N:
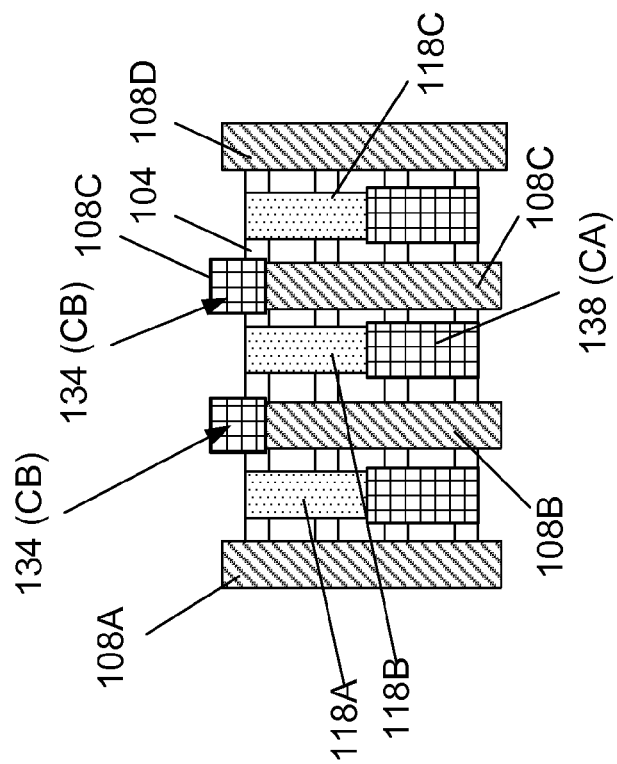

FIGS. 2A-2N depict various methods disclosed herein for forming a gate contact above an active region of a semiconductor device. Many of the drawings contain a simplistic plan view of the product 100 in the upper right-hand corner of the drawings. The cross-sectional views depicted in the drawings are taken where indicated in the plan view of the drawings. More specifically, the view X-X is a cross-sectional view taken through the gate structures 108A-D above the active region in a direction parallel to the current transport direction of the FinFET devices; the view Y-Y is a cross-sectional view taken through the gate structure 108B in an area above an isolation region (not shown in the plan view) where a gate contact structure (CB) will be formed to contact the gate electrode of the gate structure 108B; and the view Z-Z is a cross-sectional view taken through the trench silicide structure 118B above one of the source/drain regions in a direction that is perpendicular to the current transport direction of the FinFET devices.

The illustrative product 100 will be formed in and above a semiconductor substrate 102. The transistor devices depicted herein may be either NMOS or PMOS transistors, they may be any type of transistor device, e.g., either planar or FinFET transistor devices, and the gate electrodes and gate insulation layers of the gate structures of such devices may be formed by performing well-known gate-first or replacement gate processing techniques. Additionally, various doped regions, e.g., halo implant regions, well regions and the like, are not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. The various components and structures of the device disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

FIG. 2A is a cross-sectional view of the integrated circuit product 100 comprised of a plurality of transistor devices formed in and above the semiconductor substrate 102. Various layers of insulating materials shown in the cross-sectional views are not depicted in the plan view so as not to obscure the various inventions disclosed herein. At the point of fabrication depicted in FIG. 2A, schematically depicted isolation regions 106, e.g., shallow trench isolation regions comprised of silicon dioxide, have been formed in the substrate 102. The isolation regions 106 define an active region 105 (see views X-X and Z-Z) for where illustrative FinFET devices will be formed. The product includes four illustrative fins 104 (see view Z-Z and the plan view) that may be formed using a variety of known techniques. The fins 104 may be formed to any desired dimension and the product 100 may include any such number of fins. Of course, as noted above, the present inventions are not limited to only forming gate contacts on FinFET devices.

With continuing reference to FIG. 2A, four illustrative and schematically depicted gate structures 108A-D (collectively 108) have been formed above the substrate 102 and the fins 104 at this point in the process flow. In the depicted example, the gate structures 108 are comprised of a simplistically depicted gate electrode 110, a gate cap layer 114, and a simplistically depicted sidewall spacer 112. The gate insulation layer of the gate structures 108 is not separately depicted. A layer of insulating material 122, e.g., silicon dioxide, was formed above the isolation material 106. Also depicted in FIG. 2A are epi source/drain regions 116 and three illustrative trench silicide structures 118A-C (collectively 118). Such epi source/drain regions 116 may be omitted if desired. The view Z-Z is a cross-sectional view taken through one of the source/drain regions and depicts a cross-sectional view taken through the middle trench silicide structure 118B that is positioned in the layer of insulating material 122. As mentioned above, the trench silicide structures 118 may include a lower metal silicide portion and an upper metal portion such as tungsten. However, such details of the trench silicide structures 118 are not depicted in the attached drawings so as not to obscure the various inventions disclosed herein. As shown in the plan view, a portion of the gate structure 108B is positioned above the isolation region 106 (not shown in the plan view). Also depicted in view Z-Z are illustrative epi material regions 120 that are formed on the fins 104 in the source/drain regions after the gate structures 108 were formed and prior to the formation of the trench silicide structures 118. In one illustrative embodiment, the schematically depicted gate structures 108 include an illustrative gate insulation layer (not separately shown) and an illustrative gate electrode 110. The gate insulation layer may be comprised of a variety of different materials, such as, for example, silicon dioxide, a so-called high-k (k greater than 10) insulation material (where k is the relative dielectric constant), etc. Similarly, the gate electrode 110 may also be of a material such as polysilicon or amorphous silicon, or it may be comprised of one or more metal layers that act as the gate electrode. As will be recognized by those skilled in the art after a complete reading of the present application, the gate structure 108 of the transistor devices depicted in the drawings, i.e., the gate insulation layer and the gate electrode, is intended to be representative in nature. That is, the gate electrode 110 and the gate insulation layer may be comprised of a variety of different materials and it may have a variety of configurations, and they may be made using either the so-called "gate-first" or "replacement gate" techniques. At the point of fabrication depicted in FIG. 2A, one or more planarization processes were performed on the product 100 after the trench silicide structures 118 were formed.

FIG. 2B depicts the product 100 after a timed, TS recess etching process was performed on the trench silicide structures 118. The TS recessing etching process should be performed for such a duration that, upon completion, the upper surface 118S (view Z-Z) of the recessed trench silicide structures 118 is below the level of the upper surface 110S (view X-X) of the gate electrodes 110 of the gates 108. The differences between the levels of these two surfaces, i.e., the amount of recessing, may vary depending upon the particular application, e.g., 5-15 nm.

FIG. 2C depicts the product 100 after another layer of insulating material 124, i.e., the interlayer dielectric, such as silicon dioxide, was formed above the product 100. Thereafter, a CMP process was performed to planarize the layer of insulating material 124. The layer of insulating material 124 may be made from a variety of materials, e.g., silicon dioxide, and it may be formed by performing, for example, a CVD process. No attempt is made to depict the layer of insulating material 124 in the plan view. The insulating materials 124, 106 may be made of the same or different materials.

FIG. 2D depicts the product 100 after the layer of insulating material 124 was patterned to define a plurality of CA contact openings 126 therein so as to allow for the formation of a conductive contact to the trench silicide structures 118. The CA contact openings 126 in the layer of insulating material 124 are depicted in dashed lines in the plan view. The layer of insulating material 124 may be patterned by forming a patterned CA etch mask (not shown), such as a patterned layer of photoresist material or OPL, above the layer of insulating material 124, and thereafter performing an etching process.

FIG. 2E depicts the product 100 after a patterned CB etch mask 128, such as a patterned layer of photoresist material or OPL, was formed above the layer of insulating material 124. No attempt is made to depict the patterned CB etch mask 128 in the plan view. In this illustrative process flow, the material of the patterned CB etch mask 128 fills the previously formed CA contact openings 126. In the depicted embodiment, the patterned CB etch mask 128 has two CB contact openings 128A, 128B defined therein which correspond to locations where openings will be formed in the layer of insulating material 124 for gate contacts, as described more fully below.

FIG. 2F depicts the product 100 after an etching process was performed through the patterned CB etch mask 128 to define a plurality of CB contact openings 124A, 124B in the layer of insulating material 124. The location of the CB contact openings 124A, 124B in the layer of insulating material 124 are depicted in dashed lines in the plan view. In the depicted example, the entire CB contact opening 124A is positioned vertically above the active region 105, and the CB contact to be formed therein will establish conductive contact to the gate electrodes 110 of the gate structures 108B and 108C. In contrast, the entire CB contact opening 124B is positioned vertically above the isolation material 106, and the CB contact to be formed therein will establish conductive contact to the gate electrodes 110 of only the gate structure 108B. Additionally, the etching process performed to form the CB contact openings 124A, 124B is a timed etching process that is performed for a duration sufficient to expose the gate cap layers 114 of the gate structures 108B, 108C within the CB contact openings 124A, 124B. As shown in view Z-Z, the etching process is timed such that the CB contact opening 124A does not extend all of the way through the layer of insulating material 124 and expose the underlying trench silicide structure 118B. In the illustrative process flow depicted herein, the openings 126 for the CA contacts were formed before the openings 124A, 124B for the CB gate contacts. In other applications, the CB contact openings 124A-B may be formed before the CA contact openings 126 for the CA contacts, or the openings for both the CA contacts and the CB contacts may be formed at the same time.

FIG. 2G depicts the product 100 after a timed etching process was performed to remove the exposed portions of the gate cap layers 114 and to recess the sidewall spacer 112 positioned proximate opposite sides of the gate electrodes 110 (i.e., the spacer 112 need not actually touch the gate electrode 110). Typically, the gate cap layer 114 and the sidewall spacers 112 are made of the same material, e.g., silicon nitride, although that might not be the case in all applications. In situations where the materials are different, a first etching process may be performed to remove the exposed portions of the gate cap layers 114, followed by a second etching process to recess the sidewall spacer 112. As depicted, these etching processes expose at least an upper surface of the gate electrodes 110 and define a spacer cavity above the recessed spacer 112 and between the gate electrodes 110 and other adjacent structures or materials. In general, the recessing of the spacer 112 should be such that, upon completion, the upper surface of the recessed spacer 112 is even with or below the level of the upper surface of the trench silicide structures 118. The differences between the levels of these two surfaces may vary depending upon the particular application, e.g., 0-15 nm. In the depicted example, the patterned CB etch mask 128 remains in position during this etching process. However, if desired, the patterned CB etch mask 128 may be removed prior to performing this etching process.

FIG. 2H depicts the device 100 after several process operations were performed. First, the patterned CB etch mask 128 was removed. Thereafter, a conformal deposition process, e.g., ALD, CVD, was performed to form a conformal layer of insulating material 130 above the layer of insulating material 124 and in the CA contact openings 126 and the CB contact openings 124A-B. No attempt is made to depict the layer of insulating material 130 in the plan view. The layer of insulating material 130 may be comprised of a variety of materials, e.g., silicon dioxide, silicon nitride, etc., and it may have a thickness on the order of about 3-8 nm. Importantly, as indicated in the dashed-line regions 132, the layer of insulating material 130 essentially fills the spacer cavity above the recessed sidewall spacers 112 between the exposed upper portion of the gate electrodes 110 and the trench silicide structures 118 so as to avoid creating a short circuit between the gate electrodes 110 and the trench silicide structures 118.

FIG. 2I depicts the device 100 after a timed isotropic etch back process was performed such that, upon completion, at least the upper surfaces of the gate electrodes 110 are exposed and the remaining portions of the layer of insulating material 130 remains in the spacer cavity above the recessed sidewall spacers 112 between the exposed upper portion of the gate electrodes 110 and the trench silicide structures 118. Note that this isotropic etching process clears the layer of insulating material 130 from the CA contact openings 126.

FIG. 2J depicts the device 100 after several process operations were performed to form a CB contact 134 in the CB contact opening 124A, a CB contact 136 in the CB contact opening 124B and a plurality of CA contacts 138 in the CA contact openings 126. The CB contact 134, the CB contact 136 and the CA contacts 136 are all depicted in the plan view. In the depicted example, the entire CB contact 134 is positioned vertically above the active region 105, while the entire CB contact 136 is positioned vertically above the isolation material 106. By positioning the CB contact 134 entirely above the active region 105, valuable plot space may be conserved thereby leading to increased packing densities. Electrical shorting between the trench silicide structures is prevented by the presence of the insulating material 124 (see dashed-line region 135—view Z-Z) and the presence of the remaining portions of the layer of insulating material 130 in the spacer cavity laterally between the upper portions of the gate electrodes 110 and the trench silicide structures 118 (see dashed-line region 132—view X-X). The contacts 134, 136 and 138 are intended to be representative in nature in that they are intended to represent any type of conductive materials that may be used in forming conductive structures on integrated circuit products, e.g., tungsten, copper, etc. Moreover, the contacts 134, 136 and 138 may comprise one or more barrier layers (not shown). The contacts 134, 136 and 138 may be formed by overfilling the openings 124A-B and 126 with one or more conductive materials and thereafter performing one or more CMP processes to remove excess conductive material positioned outside of the openings above the layer of insulating material 124. At this point in the process flow, traditional metallization layers (not shown) may be formed above the product so as to establish electrical contact to the contacts 134, 136 and 138, i.e., V0 vias may be formed so as to engage the contacts 134, 136 and 138 and establish an electrical connection of metal lines in the M1 metallization layer, etc.

Figure 2M:
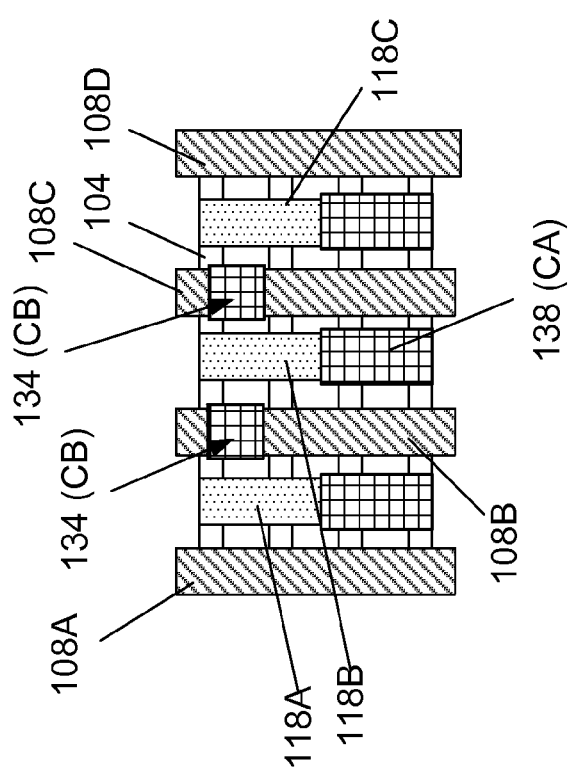

As will be appreciated by those skilled in the art, the CA contacts 138 and the CB contacts 134, 136 may be placed in a variety of different locations on the gates 108, depending upon the product being manufactured and its desired functionality. Moreover, the methods disclosed herein may be employed to produce a gate contact structure (CB) (and its associated gate contact opening) that is positioned entirely above the active region or only partially above the active region 105. Even if the gate contact (CB) is positioned only partially above the active region 105, undesirable plot space consumption may be reduced. As noted above, in the embodiment shown in FIG. 2J, the entire CB contact 134 is positioned vertically above the active region 105, while the entire CB contact 136 is positioned vertically above the isolation material 106. FIG. 2K depicts an embodiment wherein the CB contact 134 is partially positioned vertically above the active region 105 and partially above the isolation material 106, while the entire CB contact 136 is positioned vertically above the isolation material 106. FIG. 2L depicts an example wherein the entire CB contact 134 is positioned vertically above the active region 105 and contacts only one gate structure (108C), while the entire CB contact 136 is positioned vertically above the isolation material 106 and contacts a separate gate structure (108B). FIG. 2M depicts an example where two separate CB contacts 134 are each positioned vertically above the active region 105 and contact different gate structures (108B, 108C), while the CB contact 136 that was positioned vertically above the isolation material 106 has been omitted. FIG. 2N is the same as FIG. 2M except that the two separate CB contacts 134 are partially positioned vertically above the active region 105 and partially above the isolation material 106. Thus, the present inventions should not be considered to be limited to any particular arrangement of positioning of the CB gate contacts relative to other components or structures of the integrated circuit product.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a gate contact for a gate structure of a transistor device formed above an active region of a semiconducting substrate surrounded by an isolation region, said gate structure comprising a gate electrode, a gate cap layer and a sidewall spacer, the method comprising:
    forming said gate structure above at least said active region;
    forming a layer of insulating material above said gate structure;
    forming a gate contact opening in said layer of insulating material, wherein said gate contact opening is positioned at least partially vertically above said active region, said gate contact opening exposing a portion of at least said gate cap layer, said gate contact opening having exposed sidewalls that extend upward through said layer of insulating material relative to said exposed portion of said gate cap layer;
    performing at least one etching process through said gate contact opening to remove said exposed portion of said gate cap layer and recess said sidewall spacer so as to thereby define a spacer cavity positioned above said recessed sidewall spacer and expose at least an upper surface of said gate electrode within said gate contact opening;
    performing at least one process operation to fill said spacer cavity with an insulating material while leaving said upper surface of said gate electrode exposed; and
    forming a conductive gate contact in said gate contact opening that is conductively coupled to said exposed upper surface of said gate electrode, wherein said gate contact is positioned at least partially vertically above said active region.

2. The method of claim 1, wherein forming said gate contact opening comprises forming said gate contact opening such that the entire gate contact opening is positioned above said active region.

3. The method of claim 1, wherein performing said at least one etching process through said gate contact opening to remove said gate cap layer and recess said sidewall spacer comprises performing a single etching process through said gate contact opening to remove said gate cap layer and recess said sidewall spacer.

4. The method of claim 1, wherein performing said at least one process operation to fill said spacer cavity with an insulating material comprises:
    performing a conformal deposition process to form a conformal layer of insulating material in said gate contact opening so as to overfill said spacer cavity and to line said exposed sidewalls of said gate contact opening; and
    performing an etching process so as to remove portions of said conformal layer of insulating material while a remaining portion of said conformal layer of insulating material is positioned in said spacer cavity above said recessed sidewall spacer.

5. The method of claim 4, wherein performing said etching process so as to remove portions of said conformal layer of insulating material comprises performing an isotropic etching process so as to remove portions of said conformal layer of insulating material.

6. The method of claim 1, wherein said gate cap layer and said sidewall spacer are comprised of silicon nitride.

7. The method of claim 1, wherein said transistor device is one of a FinFET transistor device or a planar transistor device.

8. The method of claim 1, wherein said gate electrode is comprised of at least one layer of metal.

9. The method of claim 1, wherein said gate contact is comprised of tungsten or copper.

10. A method of forming a gate contact for a gate structure of a transistor device formed above an active region of a semiconducting substrate surrounded by an isolation region, said gate structure comprising a gate electrode, a gate cap layer and a sidewall spacer, the method comprising:
    forming said gate structure above at least said active region;
    forming a layer of insulating material above said gate structure;
    forming a patterned etch mask above said layer of insulating material;
    performing an etching process through said patterned etch mask to form a gate contact opening that extends through said layer of insulating material, wherein the entire gate contact opening is positioned vertically above said active region, said gate contact opening exposing a portion of at least said gate cap layer and sidewall surfaces of said layer of insulating material;
    performing at least one etching process through said gate contact opening to remove said exposed portion of said gate cap layer and recess said sidewall spacer so as to thereby define a spacer cavity positioned above said recessed sidewall spacer and expose at least an upper surface of said gate electrode within said gate contact opening;
    performing a conformal deposition process to form a conformal layer of insulating material in said gate contact opening so as to overfill said spacer cavity, to cover said exposed upper surface of said gate electrode, and to line said exposed sidewall surfaces of said layer of insulating material;
    performing an etching process so as to remove portions of said conformal layer of insulating material and expose at least said upper surface of said gate electrode while a remaining portion of said conformal layer of insulating material is positioned in said spacer cavity above said recessed sidewall spacer; and forming a conductive gate contact in said gate contact opening that is conductively coupled to said exposed upper surface of said gate electrode, wherein the entire conductive gate contact is positioned vertically above said active region.

11. The method of claim 10, wherein performing said at least one etching process through said gate contact opening to remove said gate cap layer and recess said sidewall spacer comprises performing a single etching process through said gate contact opening to remove said gate cap layer and recess said sidewall spacer.

12. The method of claim 10, wherein performing said etching process so as to remove portions of said conformal layer of insulating material comprises performing an isotropic etching process so as to remove portions of said conformal layer of insulating material.

* * * * *